United States Patent [19]
Groover et al.

[11] Patent Number: 5,598,031
[45] Date of Patent: Jan. 28, 1997

[54] ELECTRICALLY AND THERMALLY ENHANCED PACKAGE USING A SEPARATE SILICON SUBSTRATE

[75] Inventors: Richard L. Groover, Santa Clara; William K. Shu; Sang S. Lee, both of Sunnyvale; George Fujimoto, Santa Clara, all of Calif.

[73] Assignee: VLSI Technology, Inc., San Jose, Calif.

[21] Appl. No.: 328,939

[22] Filed: Oct. 25, 1994

Related U.S. Application Data

[63] Continuation of Ser. No. 82,122, Jun. 23, 1993, abandoned.

[51] Int. Cl.⁶ .......................... H01L 23/495; H01L 23/06
[52] U.S. Cl. .......................... 257/668; 257/676; 257/684; 257/702
[58] Field of Search ...................................... 257/666, 668, 257/676, 684, 701, 702

[56] References Cited

U.S. PATENT DOCUMENTS

| | | | |
|---|---|---|---|
| 3,526,814 | 9/1970 | Piedra et al. | 317/234 |
| 4,047,198 | 9/1977 | Sekhon et al. | 357/82 |
| 4,883,116 | 11/1989 | Seidenberg et al. | 165/104.26 |
| 4,926,242 | 5/1990 | Itoh et al. | 357/81 |
| 5,015,803 | 5/1991 | Mahulikar et al. | 257/668 |
| 5,019,533 | 5/1991 | Cuddihy et al. | 437/199 |
| 5,061,987 | 10/1991 | Hsia | 357/71 |
| 5,068,715 | 11/1991 | Wade et al. | 357/81 |
| 5,070,390 | 12/1991 | Shimizu | 257/668 |
| 5,111,278 | 5/1992 | Eichelberger | 357/75 |

FOREIGN PATENT DOCUMENTS

| | | |
|---|---|---|
| 0509825 | 10/1992 | European Pat. Off. . |
| 0516185 | 12/1992 | European Pat. Off. . |
| 0520679 | 12/1992 | European Pat. Off. . |
| 2684803 | 6/1993 | France . |
| 56-134747 | 1/1982 | Japan . |
| 63-015447 | 1/1988 | Japan . |
| WO-A-9317455 | 9/1993 | WIPO . |
| WO-A-9320586 | 10/1993 | WIPO . |

*Primary Examiner*—Sara W. Crane
*Assistant Examiner*—David Ostrowski
*Attorney, Agent, or Firm*—Patrick T. King

[57] ABSTRACT

An integrated-circuit package assembly includes a separate silicon substrate to which an integrated-circuit die is fixed. The separate silicon substrate serves as a heat spreader for the integrated-circuit die. The separate silicon substrate to which the integrated-circuit die is fixed is packaged in either a molded package body or a cavity-type package body. For the molded package body, the package body is molded around a leadframe, the integrated-circuit die, and the separate silicon substrate to which the integrated-circuit die is fixed. For a molded package body, the leadframe has bonding fingers formed at the inward ends thereof which are attached to the separate silicon substrate or the lead frame may have a die-attach pad to which is fixed the separate silicon substrate. For the cavity-type package, the package body includes a mounting surface formed adjacent to a cavity formed therein and the mounting surface has the separate silicon substrate fixed to the top surface thereof. The cavity-type body is formed of a ceramic material or as a multi-layer printed-circuit board. One or more interposer areas are formed on the top surface of the silicon substrate for attachment of connection wires from the integrated-circuit die or the leadframe. A portion of the interposer can extend between the integrated circuit die and the top surface of the silicon substrate to accommodate integrated-circuit dies of various sizes. The interposer includes a layer of oxide formed on the surface of the silicon substrate, which layer of oxide is covered with a layer of conductive material.

40 Claims, 4 Drawing Sheets

ELECTRICALLY AND THERMALLY ENHANCED PACKAGE USING A SEPARATE SILICON SUBSTRATE

This is a continuation of application Ser. No. 08/082,122 filed Jun. 23, 1993, now abandoned.

BACKGROUND OF THE INVENTION

1. Field of the Invention

This invention relates to integrated-circuit packages and, more particularly, to techniques for cooling integrated-circuit packages.

2. Prior Art

Previously, power and ground planes have been added to molded-plastic and hermetically-sealed integrated-circuit packages to improve the electrical performance of these packages. The added power and ground planes provided improved electrical performance by lowering the inductance of the power and ground leads. Additional power and ground planes are provided by using multi-layer leadframes and/or multi-layer printed-circuit-board substrates.

To improve the thermal performance of an integrated-circuit package, heatsinks are added either internally or externally to the packages. Adding a heatsink to an electrically enhanced package, as described above, provides an integrated-circuit package with both improved electrical performance and with improved thermal performance.

These prior packaging techniques for improving electrical and/or thermal performance tend to be expensive, consume large amounts of production time, and may present reliability problems due to thermal mismatches. Prior art thermally conductive heatsink materials, such as copper, aluminum, alumina nitride, and multi-layer printed-circuit boards, are costly.

The need has arisen for an integrated-circuit package configuration which incorporates a cost effective heatsink or heat spreader material into the designs of plastic or cavity-type packages for integrated-circuits.

SUMMARY OF THE INVENTION

It is therefore an object of the invention to provide an integrated-circuit package configuration for either plastic packages or for cavity-type packages which incorporates a cost effective heatsink or heat spreader material.

In accordance with this and other object of the invention, an integrated-circuit package assembly is provided for an integrated-circuit die. The package assembly is for various types of packages includes molded plastic packages and cavity-type packages, formed of materials such as ceramic or multi-layer printed-circuit board materials.

An important element of a package according to the invention is a separate and distinct silicon substrate. The separate silicon substrate has a top surface and a bottom surface with the integrated-circuit die being fixed to the top surface of the separate silicon substrate. The separate silicon substrate serves as a heat spreader for the integrated-circuit die to diffuse heat away from the integrated-circuit die.

The separate silicon substrate with the integrated-circuit die fixed to the separate silicon substrate can be packaged in several different types of package bodies, such as, for example, molded plastic packages and cavity-type packages, formed of materials such as ceramic or multi-layer printed-circuit boards.

For the molded package body, the molded package body is formed around a leadframe, the integrated-circuit die, and the separate silicon substrate to which the integrated-circuit die is fixed. The leadframe has leads extending inwardly towards a central region of the leadframe and bonding fingers are formed at the inward ends of the leads. For a lead frame without a die-attach paddle, the bonding fingers are attached directly to the margins of the separate silicon substrate. Where the lead frame has a die-attach paddle, the separate silicon substrate is fixed to the bottom side of the die-attach paddle and the integrated-circuit die is fixed to the top side of the die-attach paddle.

Where the separate silicon substrate has lateral dimensions greater than the lateral dimensions of the integrated-circuit die, one or more interposer areas are formed on the top surface of the silicon substrate for attachment of connection wires from the integrated-circuit die or the leadframe. A portion of the interposer is formed on the top surface of the separate silicon substrate and extends between the integrated circuit die and the top surface of the silicon substrate to accommodate integrated-circuit dies of various sizes. The interposer is formed, for example, on the surface of the silicon substrate as a layer of oxide which is covered with a layer of conductive material.

For the cavity-type package body with a cavity formed therein, the package body includes a mounting surface formed adjacent to the cavity. The mounting surface has the separate silicon substrate fixed to the top surface thereof.

A method is provided for cooling an integrated-circuit die. The method includes fixing an integrated circuit die to the top surface of a separate silicon substrate having a top surface and a bottom surface; packaging the separate silicon substrate with the integrated-circuit die fixed to the separate silicon substrate in a package body; and conducting heat from the integrated-circuit die using a separate silicon substrate.

The step of packaging the separate silicon substrate with the integrated-circuit die fixed to the separate silicon substrate in a package body includes the step of molding the package body around a leadframe, the integrated-circuit die and the separate silicon substrate to which the integrated-circuit die is fixed. The step of packaging the separate silicon substrate with the integrated-circuit die fixed to the separate silicon substrate in a package body includes the steps of providing a cavity in a cavity-type package with a mounting surface formed adjacent to the cavity and fixing the separate silicon substrate to the mounting surface. The step of attaching connection wires from the integrated-circuit die or the leadframe to at least one interposer area formed on the top surface of the silicon substrate.

The invention further includes the step of attaching connection wires from the integrated-circuit die or the leadframe to at least one interposer area formed on the top surface of the silicon substrate. The step of attaching connection wires from the integrated-circuit die or the leadframe to at least one interposer area formed on the top surface of the silicon substrate includes attaching connection wires to the at least one interposer which extends between the integrated circuit die and the top surface of the silicon substrate. The method also includes the step of attaching the connection wires to a layer of conductive material which is formed over a layer of oxide formed on the surface of the silicon substrate.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
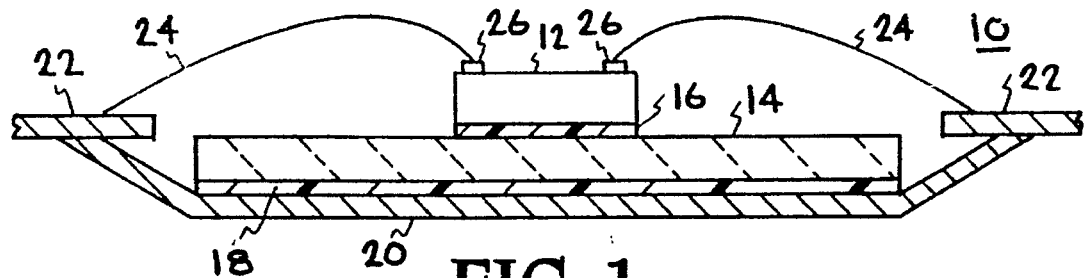
FIG. 1 is a sectional view of a package assembly with an integrated-circuit die mounted to a separate heat conductive silicon substrate, where the separate heat conductive silicon substrate is mounted to the die-attach pad of a lead frame.

FIG. 1 shows a package assembly 10 provided according to the invention for a package having a molded body. The package assembly 10 has the bottom surface of an integrated-circuit die 12 mounted to the top surface of a separate heat conductive silicon substrate 14 using a thin layer 16 of die-attach material. The die-attach material is a standard epoxy die-attach material, which is thermally conductive and which is made electrically conductive by adding, for example, silver or another conductive material.

In this embodiment of the invention, the separate heat conductive silicon substrate 14 is fixed with a layer of suitable adhesive material 18 to a die-attach pad 20 of a leadframe. The leadframe has leads which extend inwardly towards a central region of the leadframe. The leads have bonding fingers 22 formed at the inward ends thereof. Bonding wires 24 extend from the wire-bonding pads 26 formed on the top surface of the integrated circuit die 12 to the bonding fingers 22, as indicated in the Figure.

As shown in the Figure, the silicon substrate 14 is a separate piece which can have lateral dimensions greater than the lateral dimensions of the integrated-circuit die 12. The separate silicon substrate 14 functions as a heat sink or heat spreader to enhance the thermal performance of the package assembly 10. The separate silicon substrate 14 is also available to be used as a single or multi-layer interposer.

Use of silicon as a substrate material has certain advantages. Silicon as a substrate material is inexpensive and readily available for the application described herein below as reject wafers from an integrated-circuit fabrication line. Silicon is thermally matched to the package components. The characteristics of the silicon substrate match those of the integrated-circuit die. Crystalline silicon has good temperature characteristics. Silicon also has the advantage that depositing of conductors on its surface is readily accomplished using standard integrated-circuit, multi-layer-metal technology. The thermal coefficient of expansion mismatches internal to a package are the same as those in current package designs. Finally, existing packaging materials and technologies can be used.

Figure 2:
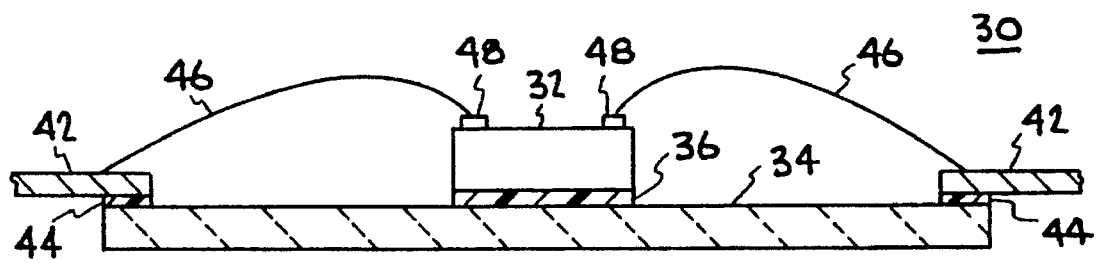
FIG. 2 is a sectional view of a package assembly with an integrated-circuit die mounted to a separate heat conductive silicon substrate, which is used as the die-attach pad portion of a lead frame.

FIG. 2 shows another molded-package assembly 30 which includes an integrated-circuit die 32 mounted to the top surface of a separate heat conductive silicon substrate 34 using a thin layer 36 of die-attach material. The die-attach material is a standard epoxy die-attach material, which is thermally conductive and which, if necessary, is made electrically conductive by adding, for example, silver or another conductive material.

In this embodiment, no die-attach pad is used. Bonding fingers 42 formed at the inward ends of leads of a leadframe are fixed with a layer 44 of substrate-attach material to the peripheral areas of the top surface of the separate heat conductive silicon substrate 34. Bonding wires 46 extend from wire-bonding pads 48 formed on the top surface of the integrated-circuit die 32 to the bonding fingers 42, as indicated in the Figure.

Figure 3:
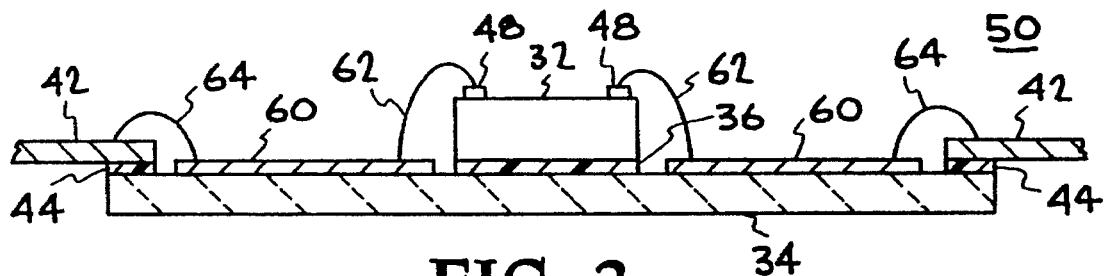
FIG. 3 is a sectional view of a package assembly similar to the assembly of FIG. 2 and further including interposers, or connections areas, formed on the surface of the silicon substrate.

FIG. 3 shows a molded-package assembly 50, which is similar to the assembly of FIG. 2 so that the same reference numerals are used for like elements. This embodiment of the invention includes interposers 60, or connections areas, which are conveniently formed on the surface of the silicon substrate. The interposers are formed of conductive material such as, for example, aluminum deposited on the top surface of the silicon substrate 34. The interposers are formed with various shapes, including, for example, elongated strips extending from near the integrated-circuit die 32 to the peripheral areas on the top surface of the silicon substrate 34.

Bonding wires 62 extend from the wire-bonding pads 48 formed on the top surface of the integrated-circuit die 32 to the inner ends of the interposers 60 near the integrated-circuit die 32 as indicated in the Figure. The outer ends of the interposers 60 are connected by bonding wires 64 to the bonding fingers 42, as indicated in the Figure.

Figure 4:
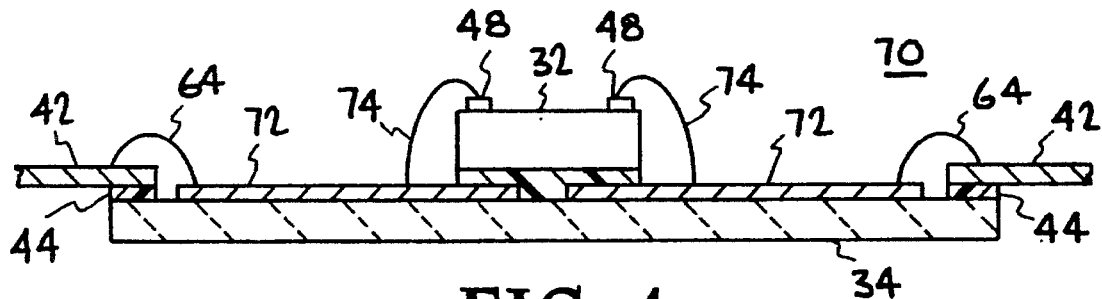
FIG. 4 is a sectional view of a package assembly similar to the assembly of FIG. 3 where the interposers extend under the integrated-circuit die.

FIG. 4 shows a molded-package assembly 70, which is similar to the assembly of FIG. 3, so that the same reference numerals are used for like elements. In this embodiment, interposers 72 are provided which extend under the integrated-circuit die 32, as shown in the Figure. This arrangement accommodates various die sizes so that a standard package is provided for a wide range of die sizes. This type of package configuration is particularly useful in an environment where limited production runs of different die sizes are to be run. Only one or a small number of different standard package configurations must then be inventoried.

With this embodiment of the invention, various sizes of integrated-circuit dies 32 are accommodated. Bonding wires 74 from the bonding pads 48 on a particular die 32 are bonded near the die 32, as indicated in the Figure. For different die sizes, the bonding location on the interposer 72 will vary, depending upon the size of the die. Thus, for a die larger than the die shown, bonding sites on the interposer 72 will be closer towards the periphery of the silicon substrate 34.

Figure 5:
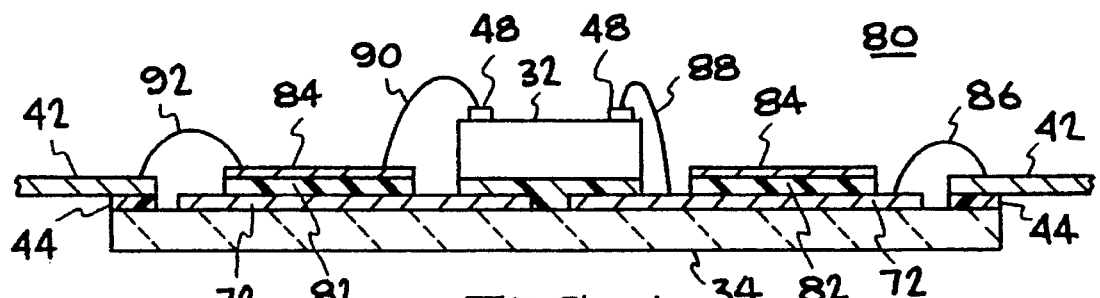
FIG. 5 is a sectional view of a package assembly similar to the assembly of FIG. 4 where the interposers have more than one conductive layer formed thereon.

FIG. 5 shows another embodiment of a molded-package assembly which is similar to the assembly of FIG. 4, so that the same reference numerals are used for like elements. In this embodiment, the interposers 72 extend under the integrated-circuit die 32, as shown in the Figure to accommodate a range of various die sizes. This type of package configuration is particularly useful in an environment where limited production runs of somewhat different die sizes are to be run.

In this embodiment, an insulation layer 82 is formed over the interposers 72. The insulation layer is formed, for example, as a layer 82 of oxide material deposited on the surface of the silicon substrate 72. The layer of oxide 82 has a layer 84 of conductive material formed on its top surface. These alternate layers of insulating material can be repeated, as desired. Various portions of conductive layers can be exposed and made available for connections.

Various wire-bond connections are available with this configuration. A bonding wire 86 is connected between the bonding finger 42 and the interposer 72. A bonding wire 88 is connected between the bonding pad 48 on the integrated-circuit die 32 and the interposer 72. A bonding wire 90 is connected between another bonding pad 48 on the integrated-circuit die 32 and the conductive layer 84. Another bonding wire 92 is connected between the conductive layer 84 and a bonding finger 42.

Figure 6:
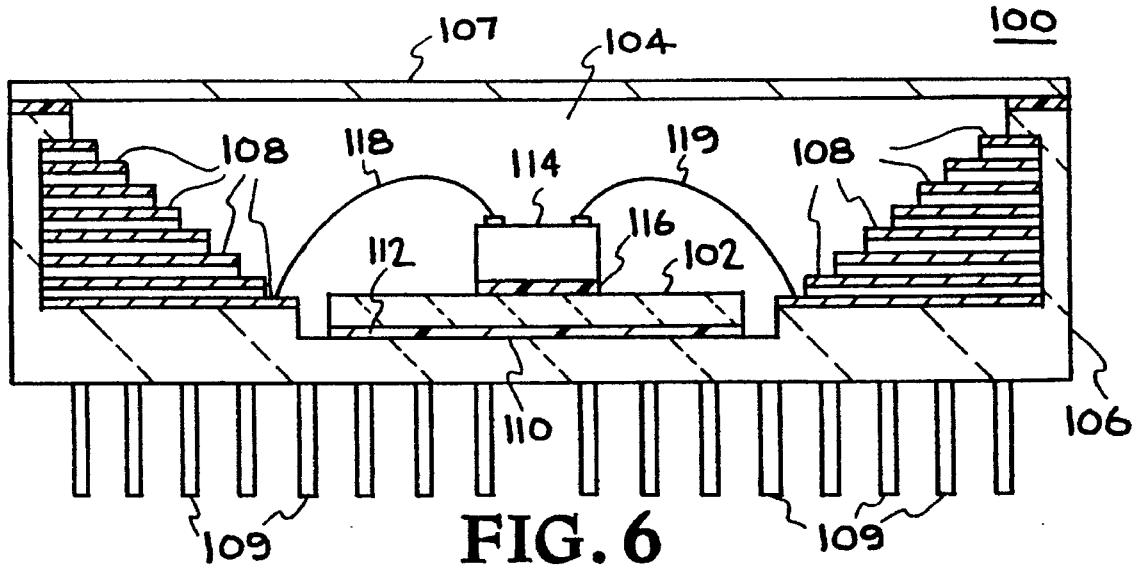
FIG. 6 is a sectional view of a package assembly in which a separate silicon substrate is mounted within a cavity formed in a ceramic pin grid array (PGA) package body having a number of conductive layers formed therein.

FIG. 6 shows a pin-grid-array (PGA) package assembly 100 in which a separate silicon substrate 102 is mounted within a cavity 104 formed in a cavity-type package body 106 formed of a ceramic material. The cavity is covered with a lid member 107 which is fixed to the ceramic package body 106 with a layer of an appropriate material. The package body 106 has number of conductive layers (typically shown as 108) formed therein. Internal connections (not shown) are conventionally provided between various ones of the conductive layers 108 and respective ones of the external package pins (typically shown as 109).

A mounting surface 110 for the separate silicon substrate 102 is formed on the base portion of the ceramic PGA package body adjacent to the cavity 104, as indicated in the Figure. The separate silicon substrate 102 is mounted to the mounting surface 104 with a thin layer 112 of suitable substrate-attachment material. This material can be a standard epoxy material, which is thermally conductive and which is made electrically conductive by adding, for example, silver or another conductive material.

The separate silicon substrate 102 also serves as a die-attach pad for an integrated-circuit die 114 which is attached to the top surface of the separate silicon substrate 102 with a thin layer 116 of die-attach material. Wire-bonded bonding wires 118, 119 typically extend from wire-bonding pads formed on the top surface of the integrated-circuit die 114 to various exposed portions of the conductive layers 108, as indicated in the Figure.

Figure 7:
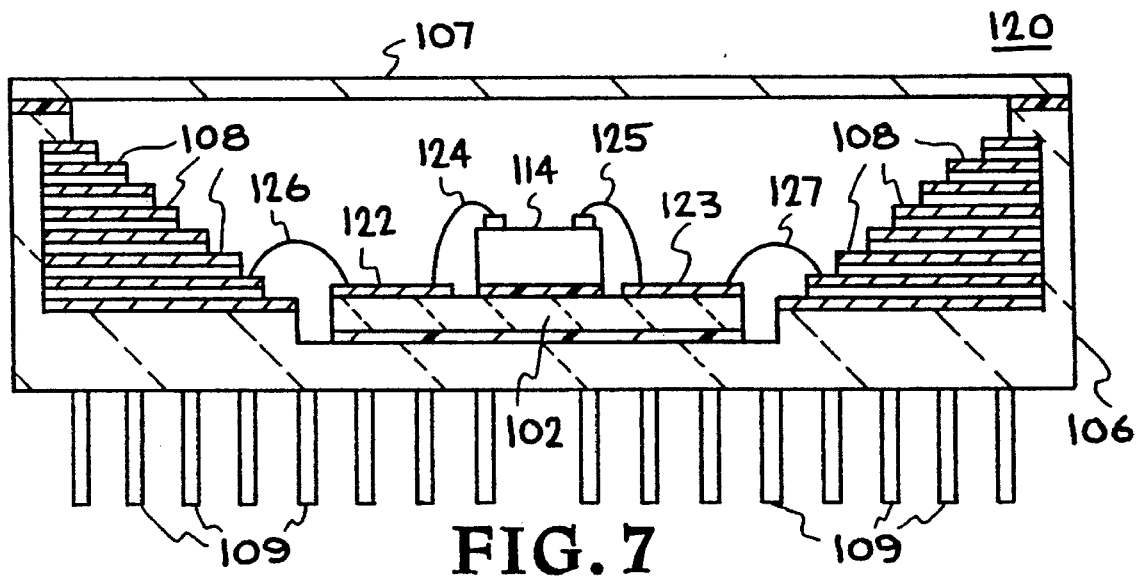
FIG. 7 is a sectional view of a package assembly in which a separate silicon substrate is mounted within a cavity formed in the ceramic PGA package body of FIG. 6 and which further includes interposers, or connections areas, formed on the surface of the silicon substrate.

FIG. 7 shows another embodiment of a PGA ceramic package assembly 120, which is similar to the assembly of FIG. 6, so that the same reference numerals are used for like elements. The separate silicon substrate 102 is mounted within the cavity formed within the ceramic PGA package body 106. In this case the package assembly 120 further includes interposers 122, 123, or conductive connection areas, formed on the upper surface of the silicon substrate 102, as illustrated.

The interposers 122, 123 provide intermediate connections areas so that shorter bonding wires can be used, in comparison to the longer bonding wires 118, 119 of FIG. 6. Wire-bonded bonding wires 124, 125 extend between bonding pads formed on the top surface of the integrated-circuit die 114 and various portions of the interposers 122, 123, as indicated in the Figure. Shorter bonding wires 126, 127 extend respectively between from the outer areas of the interposers 122, 123 to various exposed portions of the conductive layers 108, as indicated in the Figure.

Figure 8:
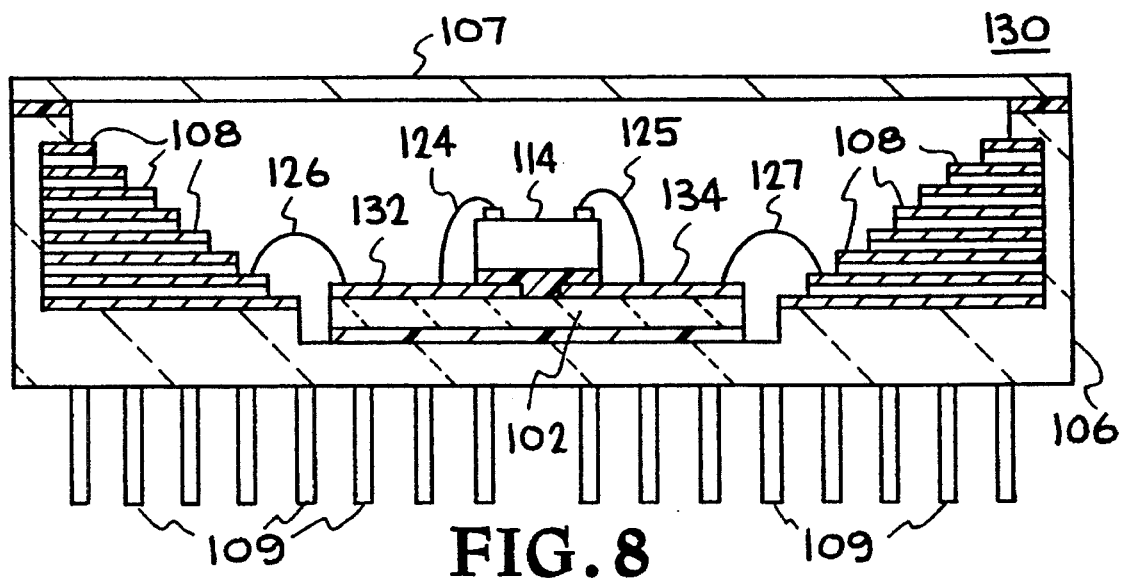
FIG. 8 is a sectional view of a package assembly similar to the assembly of FIG. 7 where the interposers extend under the integrated-circuit die.

FIG. 8 shows a sectional view of another embodiment of a package assembly 130 which is very similar to the assembly of FIG. 7 so that the same reference numerals are used for like elements. In this case, interposers 132, 134 extend beneath the die 114, as illustrated. This permits a number of different die sizes to be accommodated by one package configuration.

Figure 9:
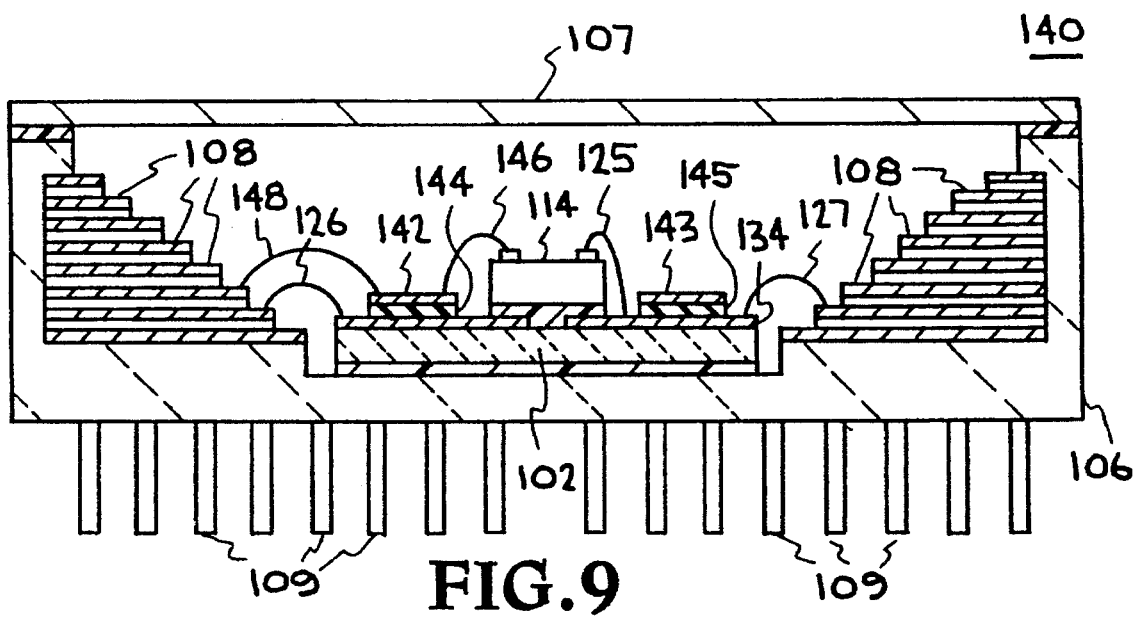
FIG. 9 is a sectional view of a package assembly similar to the ceramic PGA package assembly of FIG. 8 with the addition of multi-layer interposers being formed on the top surface of the silicon substrate.

FIG. 9 shows a sectional view of an embodiment of a package assembly 140 which is very similar to the assembly of FIG. 8 so that the same reference numerals are used for like elements. In this case the interposers have additional conductive layers 142, 143 formed over respective layers 144, 146 of oxide formed on the surface of the silicon substrate. These additional conductive layers 142, 143 are used, for example, as connection areas for a bonding wire 146 from a bonding pad on the die 114 or for a bonding wire 148 from one of the conductive layers 108 of the package body 106.

Additional alternate layers of oxide and conductive material can be formed to provide additional intermediate connection areas, as required for particular applications, to provide multi-layer interposers on the top surface of the silicon substrate 102.

FIGS. 10–13 illustrate PGA package assemblies which use a package body 150, which is fabricated as a multi-layer printed-circuit board with a number of conductive layers 152 formed therein. These package assemblies are similar to the ceramic package assemblies illustrated in FIGS. 6–10.

Figure 10:
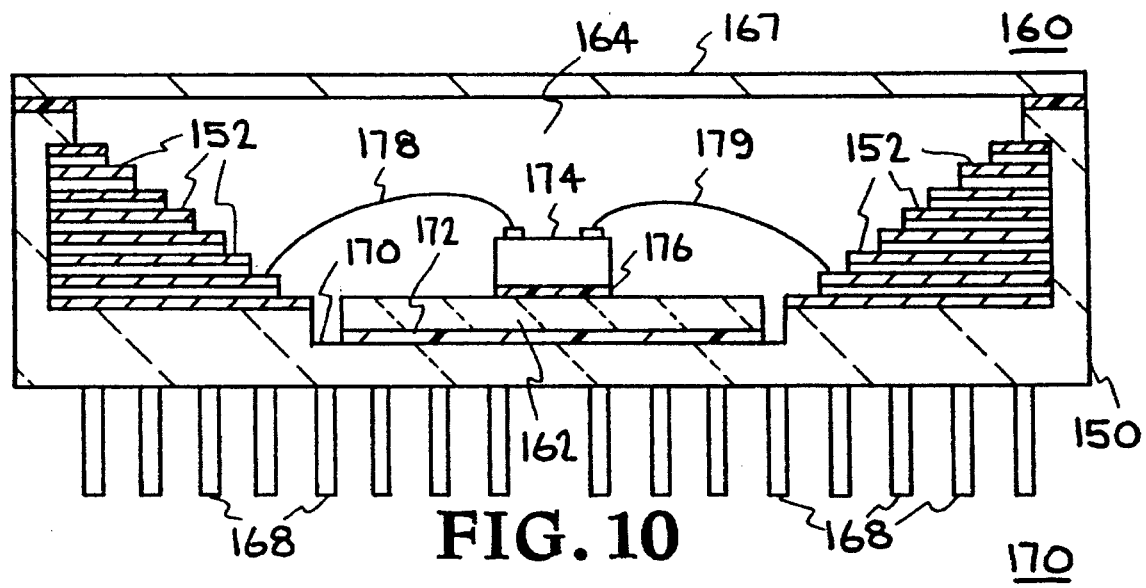
FIG. 10 is a sectional view of a PGA package assembly in which a separate silicon substrate is mounted within a cavity formed in a package body, which is fabricated as a multi-layer printed-circuit board with a number of conductive layers formed therein.

FIG. 10 illustrates a pin-grid-array (PGA) package assembly 160 in which a separate silicon substrate 162 is mounted within a cavity 164 formed in the cavity-type package body 150, which is formed as a multi-layer printed-circuit board. The cavity is covered with a lid member 167 which is fixed to the ceramic package body 150 with a layer of an appropriate material. The package body 150 has the number of conductive layers (typically shown as 152) formed therein. Internal connections (not shown) are conventionally provided between various ones of the conductive layers 152 and respective ones of the external package pins (typically shown as 168).

A mounting surface 170 for the separate silicon substrate 162 is formed on the base portion of the multi-layer printed-circuit board PGA package body adjacent to the cavity 164, as indicated in the Figure. The separate silicon substrate 162 is mounted to the mounting surface 170 with a thin layer 172 of suitable substrate-attachment material. This material can be a standard epoxy material, which is thermally conductive and which is made electrically conductive by adding, for example, silver or another conductive material.

The separate silicon substrate 162 also serves as a die-attach pad for an integrated-circuit die 174 which is attached to the top surface of the separate silicon substrate 162 with a thin layer 176 of die-attach material. Wire-bonded bonding wires 178, 179 typically extend from wire-bonding pads formed on the top surface of the integrated-circuit die 174 to various exposed portions of the conductive layers 152, as indicated in the Figure.

Figure 11:
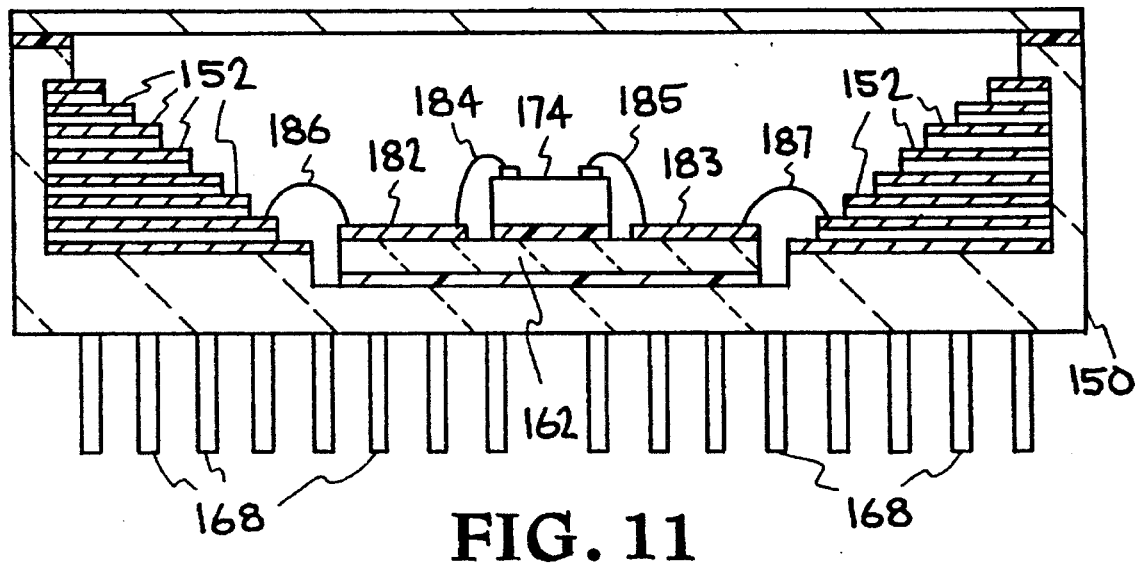
FIG. 11 is a sectional view of the PGA package assembly of FIG. 10 in which a separate silicon substrate is mounted within a cavity formed in a multi-layer printed circuit package body and which further includes interposers, or connections areas, formed on the surface of the silicon substrate.

FIG. 11 shows a sectional view of another embodiment of a multi-layer printed-circuit board package assembly 180 which is very similar to the assembly of FIG. 10, so that the same reference numerals are used for like elements. In this case, interposers 182, 183 extend beneath the die 174, as illustrated. This permits a number of different die sizes to be accommodated by one package configuration.

The interposers 182, 183 provide intermediate connections areas so that shorter bonding wires can be used, in comparison to the longer bonding wires 178, 179 of FIG. 10. Wire-bonded bonding wires 184, 185 extend between bonding pads formed on the top surface of the integrated-circuit die 174 and various portions of the interposers 182, 183, as indicated in the Figure. Shorter bonding wires 186, 187 extend respectively between from the outer areas of the interposers 182, 183 to various exposed portions of the conductive layers 152, as indicated in the Figure.

Figure 12:
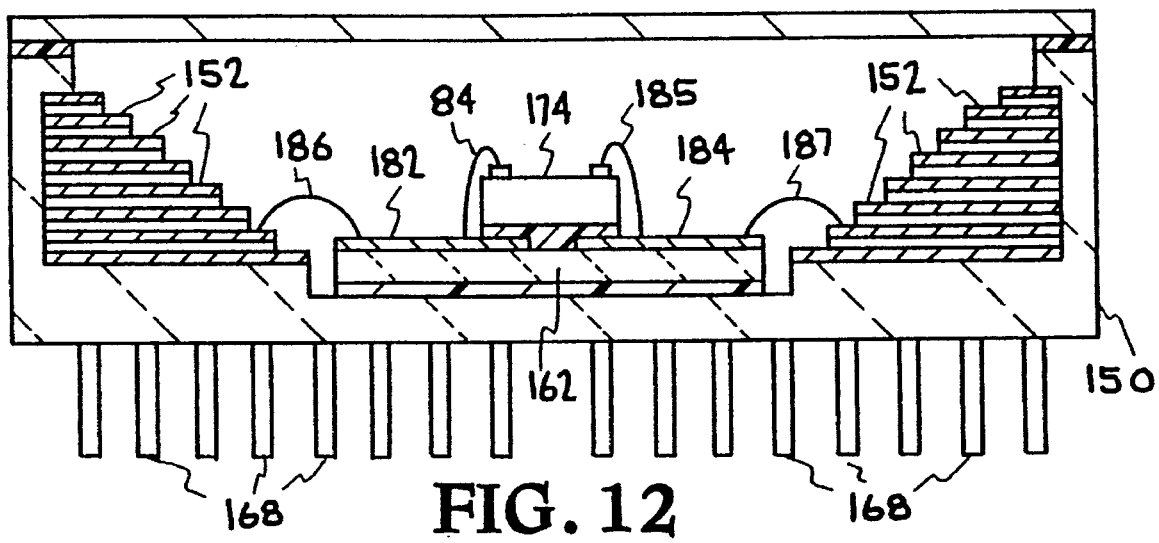
FIG. 12 is a sectional view of a PGA package assembly with the multi-layer printed circuit package body similar to the assembly of FIG. 11 where the interposers extend under the integrated-circuit die.

FIG. 12 shows a sectional view of another embodiment of a multi-layer printed circuit body package assembly 190 which is very similar to the assembly of FIG. 11 so that the same reference numerals are used for like elements. In this case, interposers 182, 184 extend beneath the die 174, as illustrated. This permits a number of different die sizes to be accommodated by one package configuration.

Figure 13:
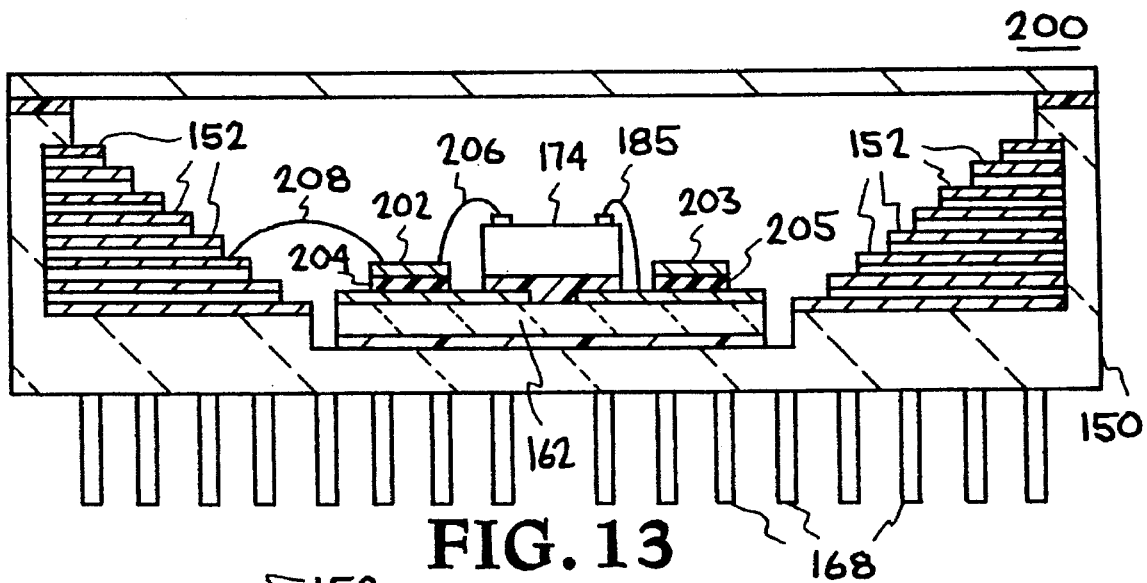
FIG. 13 is a sectional view of a PGA package assembly similar to the package assembly of FIG. 12 with the addition of multi-layer interposers being formed on the top surface of the silicon substrate.

FIG. 13 shows a sectional view of an embodiment of a multi-layer printed circuit body package assembly 200 which is very similar to the assembly of FIG. 12 so that the same reference numerals are used for like elements. In this case the interposers have additional conductive layers 202, 203 formed over respective layers 204, 205 of oxide formed on the surface of the silicon substrate. These additional conductive layers 202, 203 are used, for example, as connection areas for a bonding wire 206 from a bonding pad on the die 174 or for a bonding wire 208 from one of the conductive layers 152 of the package body 150.

Additional alternate layers of oxide and conductive material can be formed to provide additional intermediate connection areas, as required for particular applications, to provide multi-layer interposers on the top surface of the silicon substrate 162.

Figure 14:
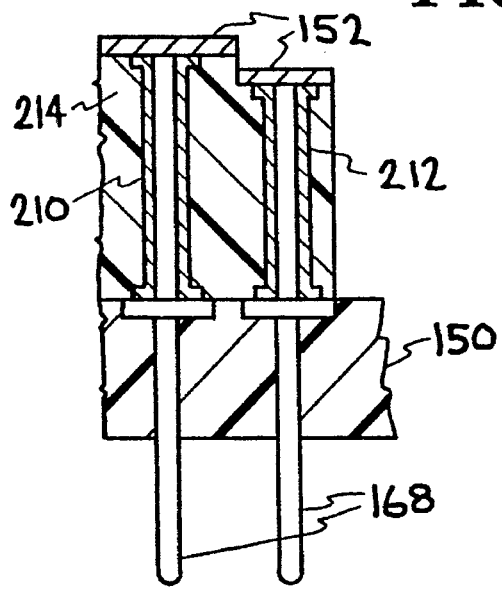
FIG. 14 is an enlarged, sectional view of a portion of the PGA package assembly of FIG. 13 showing typical interconnections between various external package pins and various conductive layers in the package body.

FIG. 14 shows a portion of the PGA package assembly 200 of FIG. 13, illustrating typical interconnections between various typical external package pins 168 and various typical conductive layers 152 in the package body. In this case, plated-through holes 210, 212 are typically shown extending through the body of the package to provide conductive connections between the conductive layers 1152 and the external package pins 168.

Using the interposer with the separate silicon substrate provides for assembly of a very small die in a high pincount packages. The separate silicon substrate allows an integrated-circuit die to be bonded out in a standard package bond-out configuration and in a universal bond-out configuration without crossing wires.

As a bare substrate attached to a leadframe of a molded-plastic package, the invention provides a very cost effective solution for thermal enhancement of the package.

The separate silicon substrate could be patterned using existing integrated-circuit fabrication and processing technology to provide an interposer. The interposer reduces the wirelengths required for a die with a limited number pads in a high pincount packages. The interposer uses single level metalization techniques known in the art of fabricating integrated circuits.

If triple-layer metal patterning techniques are used on the separate silicon substrate, the invention could also be used to duplicate the pinout of an electrical and thermally enhanced with a standard metric quad flat pack (MQFP) package or a molded-plastic thermally enhanced package. If triple-layer metal patterning techniques are used on the separate silicon substrate provided according to the invention, the invention could also be used to duplicate the pinout of either an 8-layer high performance ceramic pin grid array (HPCPGA) or an 8-layer high performance plastic pin grid array (HPPPGA) package in a 5-layer high performance ceramic pin grid array (HPCPGA) or a 5-layer high performance plastic pin grid array HPPPGA package. These configurations reduce the number of required package layers from 8 to 5.

The separate silicon substrate according to the invention could also be patterned to allow for attachment of multiple integrated-circuit dies to the separate silicon substrate.

Standard techniques are employed in practicing the invention. An integrated circuit die is attached to a silicon substrate with standard epoxy die-attach material, which is thermally conductive and which is made electrically conductive by adding, for example, silver. For ceramic or plastic pin grid array (PPGA) multi-layer packages, these same epoxy attachment techniques are used. Silicon as a substrate material is inexpensive and readily available as reject wafers from integrated-circuit fabrication lines. Crystalline silicon has good temperature characteristics. Depositing of conductors is readily accomplished using integrated-circuit multi-layer-metal technology.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the Claims appended hereto and their equivalents.

We claim:

1. An integrated-circuit package assembly, comprising:

an integrated-circuit die;

a separate silicon substrate, of silicon wafer material from a silicon wafer, having a top surface and a bottom surface, said integrated-circuit die being fixed to the top surface of the separate silicon substrate, said separate silicon substrate serving as a heat spreader for the integrated-circuit die;

a package body containing the separate silicon substrate with the integrated-circuit die fixed to the separate silicon substrate, said package body being a molded package body which is formed around a leadframe, said integrated-circuit die and said separate silicon substrate to which the integrated-circuit die is fixed;

said leadframe having leads extending inwardly towards a central region of said leadframe, said leads having bonding fingers formed at the inward ends thereof wherein said separate silicon substrate has lateral dimensions greater than the lateral dimensions of said integrated-circuit die and wherein at least one interposer area is formed on said top surface of said silicon substrate for attachment of connection wires from said integrated-circuit die or said leadframe.

2. The integrated-circuit package assembly of claim 1 further comprising said bonding fingers being attached to said separate silicon substrate.

3. The integrated-circuit package assembly of claim 2, wherein said lead frame has a die-attach pad portion to which is fixed said separate silicon substrate.

4. The integrated-circuit package assembly of claim 1 wherein a portion of said at least one interposer is formed on said top surface of said separate silicon substrate extends between said integrated circuit die and the top surface of said silicon substrate.

5. The integrated-circuit package assembly of claim 1 wherein a portion of the at least one interposer which is formed on the top surface of the silicon substrate extends between the bottom surface of the integrated circuit die and the top surface of the silicon substrate to accommodate integrated-circuit dies of various sizes.

6. The integrated-circuit package assembly of claim 1, wherein said at least one interposer is formed as a layer of oxide formed on said top surface of said silicon substrate, which layer of oxide is covered with a layer of conductive material.

7. The integrated-circuit package assembly of claim 6, wherein said at least one interposer is formed as a layer of oxide formed on said top surface of said silicon substrate, over which another layer of oxide and conductive material is formed.

8. The integrated-circuit package assembly of claim 1 wherein said package body is a cavity-type package body having a cavity formed therein, wherein said package body includes a mounting surface formed adjacent to said cavity, and wherein said mounting surface has said separate silicon substrate fixed thereto.

9. The integrated-circuit package assembly of claim 8 wherein at least one interposer is formed on said top surface of said separate silicon substrate for connection of wires from said integrated-circuit die or said cavity-type package body.

10. The integrated-circuit package assembly of claim 9 wherein a portion of said at least one interposer is formed on said top surface of said silicon substrate extends between said integrated circuit die and said top surface of said silicon substrate to accommodate integrated-circuit dies of various sizes.

11. The integrated-circuit package assembly of claim 9 wherein said connections are wire-bonded wires.

12. The integrated-circuit package assembly of claim 9 wherein said at least one interposer is formed as a layer of oxide formed on said surface of said silicon substrate, which layer of oxide is covered with a layer of conductive material.

13. The integrated-circuit package assembly of claim 12, wherein said at least one interposer is formed as a layer of oxide formed on said top surface of said silicon substrate, over which alternate layers of oxide and conductive material are formed.

14. The integrated-circuit package assembly of claim 12, wherein said package body is formed of a ceramic material.

15. The integrated-circuit package assembly of claim 12, wherein said package body is formed as a printed-circuit board structure.

16. An integrated-circuit package assembly, comprising:

an integrated-circuit die;

a leadframe having leads extending inwardly towards a central region of the leadframe, said leads having bonding fingers formed at the inward ends thereof;

a separate silicon substrate, of silicon wafer material from a silicon wafer, having a top surface and a bottom surface, said integrated-circuit die being mounted on the top surface of the separate silicon substrate, said separate silicon substrate serving as a heat spreader for the integrated-circuit die;

a molded package body which contains the separate silicon substrate with the integrated-circuit die mounted thereto and which is formed around a leadframe, the integrated-circuit die and the separate silicon substrate; wherein said separate silicon substrate has lateral dimensions greater than the lateral dimensions of said integrated-circuit die and wherein at least one interposer area is formed on said top surface of said silicon substrate for attachment of connection wires from said integrated-circuit die or said leadframe.

17. The integrated-circuit package assembly of claim 16 wherein a portion of said at least one interposer is formed on said top surface of said separate silicon substrate extends between said integrated circuit die and said top surface of said silicon substrate.

18. The integrated-circuit package assembly of claim 16, wherein said at least one interposer is formed as a layer of oxide formed on said surface of said silicon substrate, which layer of oxide is covered with a layer of conductive material.

19. An integrated-circuit package assembly, comprising:

an integrated-circuit die;

a separate silicon substrate, of silicon wafer material from a silicon wafer, having a top surface and a bottom surface, said integrated-circuit die being mounted on the top surface of the separate silicon substrate, said separate silicon substrate serving as a heat spreader for the integrated-circuit die;

a package body having a cavity formed therein with a mounting surface formed in the package body adjacent to the cavity, wherein the mounting surface has the separate silicon substrate mounted thereto wherein at least one interposer is formed on said top surface of said silicon substrate for connections of wires from said integrated-circuit die or said cavity-type package body.

20. The integrated-circuit package assembly of claim 19 wherein a portion of said at least one interposer is formed on said top surface of said silicon substrate extends between said integrated circuit die and said top surface of said silicon substrate.

21. The integrated-circuit package assembly of claim 19 wherein said at least one interposer is formed as a layer of oxide formed on said top surface of said silicon substrate, which layer of oxide is covered with a layer of conductive material.

22. The integrated-circuit package assembly of claim 19, wherein said package body is formed of a ceramic material.

23. The integrated-circuit package assembly of claim 19, wherein said package body is formed as a printed-circuit board structure.

24. An integrated-circuit package assembly, comprising:
   an integrated-circuit die;
   a separate silicon substrate, of silicon wafer material from a silicon wafer, having a top surface and a bottom surface, said integrated-circuit die being fixed to the top surface of the separate silicon substrate, said separate silicon substrate serving as a heat spreader for the integrated-circuit die;
   a package body containing the separate silicon substrate with the integrated-circuit die fixed to the separate silicon substrate; and
   at least one conductive interposer area formed on the top surface of the separate silicon substrate for attachment of connection wires from the integrated circuit die.

25. The integrated-circuit package assembly of claim 24 further comprising:
   the package body being a molded package body which is formed around a leadframe, the integrated-circuit die and the separate silicon substrate to which the integrated-circuit die is fixed;
   said leadframe having leads extending inwardly towards a central region of the leadframe, said leads having bonding fingers formed at the inward ends thereof.

26. The integrated-circuit package assembly of claim 25 further comprising the bonding fingers being attached to the separate silicon substrate.

27. The integrated-circuit package assembly of claim 26, wherein the lead frame has a die-attach pad portion to which is fixed the separate silicon substrate.

28. The integrated-circuit package assembly of claim 25, wherein the separate silicon substrate has lateral dimensions greater than the lateral dimensions of the integrated-circuit die.

29. The integrated-circuit package assembly of claim 28 wherein a portion of the at least one interposer formed on the top surface of the separate silicon substrate extends between the integrated circuit die and the top surface of the silicon substrate.

30. The integrated-circuit package assembly of claim 28 wherein a portion of the at least one interposer which is formed on the top surface of the silicon substrate extends between the bottom surface of the integrated circuit die and the top surface of the silicon substrate to accommodate integrated-circuit dies of various sizes.

31. The integrated-circuit package assembly of claim 24, wherein the at least one interposer is formed as a layer of oxide formed on the surface of the silicon substrate, which layer of oxide is covered with a layer of conductive material.

32. The integrated-circuit package assembly of claim 31, wherein the at least one interposer is formed as a layer of oxide formed on the surface of the silicon substrate, over which another layer of oxide and conductive material is formed.

33. The integrated-circuit package assembly of claim 24 wherein the package body is a cavity-type package body having a cavity formed therein, wherein the package body includes a mounting surface formed adjacent to the cavity, and wherein the mounting surface has the separate silicon substrate fixed to the top surface thereof.

34. The integrated-circuit package assembly of claim 33 wherein at least one interposer is formed on the top surface of the separate silicon substrate for connection of wires from the integrated-circuit die or the cavity-type package body.

35. The integrated-circuit package assembly of claim 34 wherein a portion of the at least one interposer is formed on the top surface of the silicon substrate extends between the integrated circuit die and the top surface of the silicon substrate to accommodate integrated-circuit dies of various sizes.

36. The integrated-circuit package assembly of claim 34 wherein the connections are wire-bonded wires.

37. The integrated-circuit package assembly of claim 34 wherein the at least one interposer is formed as a layer of oxide formed on the surface of the silicon substrate, which layer of oxide is covered with a layer of conductive material.

38. The integrated-circuit package assembly of claim 37, wherein the at least one interposer is formed as a layer of oxide formed on the surface of the silicon substrate, over which alternate layers of oxide and conductive material are formed.

39. The integrated-circuit package assembly of claim 37, wherein the package body is formed of a ceramic material.

40. The integrated-circuit package assembly of claim 37, wherein the package body is formed as a printed-circuit board structure.

* * * * *